United States Patent
Martin et al.

(10) Patent No.: US 9,510,439 B2
(45) Date of Patent: Nov. 29, 2016

(54) FAULT CONTAINMENT ROUTING

(71) Applicant: Honeywell International Inc., Morristown, NJ (US)

(72) Inventors: Kenneth Lee Martin, St. Petersburg, FL (US); Lucilo De La Torre, Largo, FL (US); James Frederick Peterson, Clearwater, FL (US); Jonathan Cole, Clearwater, FL (US)

(73) Assignee: Honeywell International Inc., Morris Plains, NJ (US)

( * ) Notice: Subject to any disclaimer, the term of this patent is extended or adjusted under 35 U.S.C. 154(b) by 201 days.

(21) Appl. No.: 14/297,825

(22) Filed: Jun. 6, 2014

(65) Prior Publication Data

US 2015/0264801 A1    Sep. 17, 2015

Related U.S. Application Data

(60) Provisional application No. 61/952,369, filed on Mar. 13, 2014.

(51) Int. Cl.
| | |
|---|---|
| *G06F 17/50* | (2006.01) |
| *H01L 23/00* | (2006.01) |
| *H05K 1/02* | (2006.01) |
| *H05K 1/11* | (2006.01) |
| *H01L 23/535* | (2006.01) |
| *H01L 21/48* | (2006.01) |
| *H01L 23/48* | (2006.01) |
| *H01L 23/522* | (2006.01) |

(52) U.S. Cl.
CPC .......... *H05K 1/0237* (2013.01); *H05K 1/0218* (2013.01); *G06F 17/5077* (2013.01); *H01L 21/486* (2013.01); *H01L 23/481* (2013.01); *H01L 23/5226* (2013.01); *H01L 23/535* (2013.01); *H05K 1/115* (2013.01); *H05K 2201/0723* (2013.01); *H05K 2201/09309* (2013.01); *H05K 2201/09327* (2013.01); *H05K 2201/09536* (2013.01); *H05K 2201/09972* (2013.01)

(58) Field of Classification Search
CPC . H05K 3/0005; H01L 21/486; H01L 23/481; H01L 23/535; H01L 23/5226; G06F 17/5077
USPC ..................... 716/137, 126, 129–131; 326/41
See application file for complete search history.

(56) References Cited

U.S. PATENT DOCUMENTS

| | | | |
|---|---|---|---|
| 5,376,759 A | 12/1994 | Marx et al. | |
| 5,475,606 A | 12/1995 | Muyshondt et al. | |
| 5,719,750 A | 2/1998 | Iwane | |
| 6,265,672 B1 | 7/2001 | Eum et al. | |
| 7,646,098 B2 * | 1/2010 | Japp et al. ............ | H01L 23/145 257/758 |
| 7,688,598 B2 * | 3/2010 | Dudnikov, Jr. ...... | H05K 1/0257 361/760 |

(Continued)

*Primary Examiner* — Stacy Whitmore
(74) *Attorney, Agent, or Firm* — Fogg & Powers LLC

(57) ABSTRACT

Systems and methods described herein provide for a circuit board having multiple fault containment regions therein. The circuit board includes a first fault containment region defined, at least in part, by first and second metal layers coupled to ground. The first fault containment region includes a first signal layer between the first and second metal layers, a third metal layer between the first and second metal layers, the third metal layer connected to the first signal layer to provide a return path for the first signal layer, and a fourth metal layer between the first and second metal layers, the fourth metal layer connected to the first signal layer to provide power to the first signal layer. The circuit board also includes a second fault containment region in a plurality of layers below the first fault containment region.

20 Claims, 5 Drawing Sheets

(56) References Cited

U.S. PATENT DOCUMENTS

| | | | |
|---|---|---|---|
| 8,026,450 B2* | 9/2011 | Goergen | H05K 1/0218 174/258 |
| 8,482,929 B2 | 7/2013 | Slaton et al. | |
| 2002/0164851 A1* | 11/2002 | Wu | H01L 23/552 438/215 |
| 2004/0112617 A1* | 6/2004 | Cotton | H05K 1/0218 174/366 |
| 2005/0023241 A1* | 2/2005 | Goergen | H05K 1/0218 216/13 |
| 2005/0075070 A1* | 4/2005 | Crilly | H04W 24/00 455/13.3 |
| 2008/0066951 A1* | 3/2008 | Goergen | H05K 1/0218 174/255 |
| 2012/0229993 A1 | 9/2012 | Chou et al. | |
| 2013/0264107 A1 | 10/2013 | Meyers | |
| 2014/0264772 A1* | 9/2014 | Horng | H01L 23/552 257/621 |

\* cited by examiner

| Layer | Material | Oz | Thickness | PBA Layer Description | |
|---|---|---|---|---|---|
| 1 | Cu+plating | 0.5oz +plate | 0.0037 | Chassis GND | |
| | Polyimide | | 0.005 | | ⎫ |
| 2 | Cu | 0.5oz | 0.0007 | S2_+5V/+15V/-15V | |
| | Polyimide | | 0.005 | | |
| 3 | Cu | 0.5oz | 0.0007 | S2_5VRTN, S2_15VRTN | |
| | Polyimide | | 0.005 | | |
| 4 | Cu | 0.5oz | 0.0007 | S2_SIG1 | 112 |
| | Polyimide | | 0.005 | | |
| 5 | Cu | 0.5oz | 0.0007 | S2_SIG2 | |
| | Polyimide | | 0.005 | | |
| 6 | Cu | 0.5oz | 0.0007 | S2_5VRTN, S2_15VRTN | |
| | Polyimide | | 0.005 | | ⎭ |
| 7 | Cu | 0.5oz | 0.0007 | Chassis GND | ⎫ |
| | Polyimide | | 0.005 | | |
| 8 | Cu | 0.5oz | 0.0007 | S3_+5V/+15V/-15V | |
| | Polyimide | | 0.005 | | |
| 9 | Cu | 0.5oz | 0.0007 | S3_5VRTN, S3_15VRTN | |
| | Polyimide | | 0.005 | | |
| 10 | Cu | 0.5oz | 0.0007 | S3_SIG1 | 113 |
| | Polyimide | | 0.005 | | |
| 11 | Cu | 0.5oz | 0.0007 | S3_SIG2 | |
| | Polyimide | | 0.005 | | |
| 12 | Cu | 0.5oz | 0.0007 | S3_5VRTN, S3_15VRTN | |
| | Polyimide | | 0.005 | | ⎭ |
| 13 | Cu | 0.5oz | 0.0007 | Chassis GND | |
| | Polyimide | | 0.005 | | |
| 14 | Cu | 0.5oz | 0.0007 | Chassis GND | |
| | Polyimide | | 0.005 | | ⎫ |
| 15 | Cu | 0.5oz | 0.0007 | S1_5VRTN, S1_15VRTN | |
| | Polyimide | | 0.005 | | |
| 16 | Cu | 0.5oz | 0.0007 | S1_SIG2 | |
| | Polyimide | | 0.005 | | |
| 17 | Cu | 0.5oz | 0.0007 | S1_SIG1 | 114 |
| | Polyimide | | 0.005 | | |
| 18 | Cu | 0.5oz | 0.0007 | S1_5VRTN, S1_15VRTN | |
| | Polyimide | | 0.005 | | |
| 19 | Cu | 0.5oz | 0.0007 | S1_+5V/+15V/-15V | |
| | Polyimide | | 0.005 | | ⎭ |
| 20 | Cu | 0.5oz | 0.0007 | Chassis GND | ⎫ |
| | Polyimide | | 0.005 | | |
| 21 | Cu | 0.5oz | 0.0007 | S4_5VRTN, S4_15VRTN, S5_5VRTN, S5_15VRTN, | |
| | Polyimide | | 0.005 | | |
| 22 | Cu | 0.5oz | 0.0007 | S4_S5_SIG2 | |
| | Polyimide | | 0.005 | | |
| 23 | Cu | 0.5oz | 0.0007 | S4_S5_SIG1 | 115 |
| | Polyimide | | 0.005 | | |
| 24 | Cu | 0.5oz | 0.0007 | S4_5VRTN, S4_15VRTN, S5_5VRTN, S5_15VRTN, | |
| | Polyimide | | 0.005 | | |
| 25 | Cu | 0.5oz | 0.0007 | S4_S5_+5V/+15V/-15V | |
| | Polyimide | | 0.005 | | ⎭ |
| 26 | Cu+plating | 0.5oz + plate | 0.0037 | Chassis GND | |

FAULT CONTAINMENT ROUTING

CROSS-REFERENCE TO RELATED APPLICATIONS

This application claims the benefit of priority to U.S. Provisional Application No. 61/952,369, filed on Mar. 13, 2014, the disclosure of which is hereby incorporated herein by reference.

BACKGROUND

Some hardware, such as space flight hardware, supports redundancy of functions, and to minimize weight some redundant circuits have been packaged within a single enclosure. This can cause some circuit cards in the enclosure to be used to route signals that, if shorted, could lead to loss of a mission. This same hardware also must have separate fault containment regions which need to be maintained within a single circuit card.

SUMMARY

Systems and methods described herein provide for a circuit board having multiple fault containment regions therein. The circuit board includes a first fault containment region defined, at least in part, by first and second metal layers coupled to ground. The first fault containment region includes a first signal layer between the first and second metal layers, a third metal layer between the first and second metal layers, the third metal layer connected to the first signal layer to provide a return path for the first signal layer, and a fourth metal layer between the first and second metal layers, the fourth metal layer connected to the first signal layer to provide power to the first signal layer. The circuit board also includes a second fault containment region in a plurality of layers below the first fault containment region. The second fault containment region is defined, at least in part, by a fifth metal layer and the second metal layer. The second fault containment region includes a second signal layer between the second and fifth metal layers, a sixth metal layer between the second and fifth metal layers, the sixth metal layer connected to the second signal layer to provide a return path for the second signal layer; and a seventh metal layer between the second and fifth metal layers, the seventh metal layer connected to the second signal layer to provide power for the second signal layer.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 1 is a table illustrating a cross-sectional view of the layers of an example circuit board having fault containment regions separated by chassis ground layers.

Figure 2:
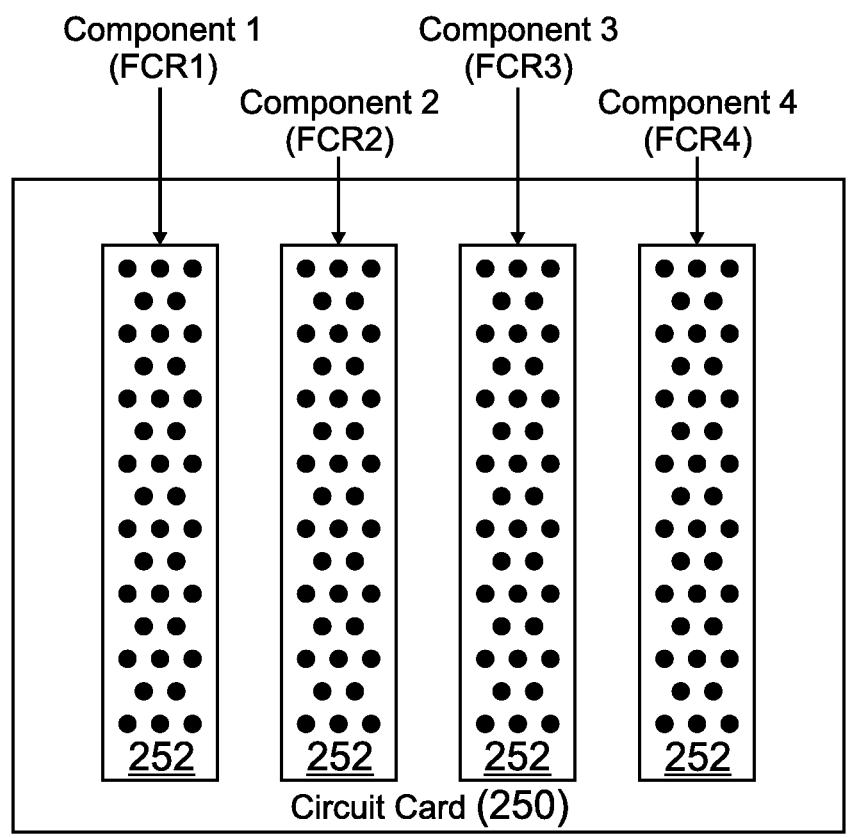
FIG. 2 is a block diagram of an example system using a circuit board such as the circuit board of FIG. 1.

In accordance with common practice, the various described features are not drawn to scale but are drawn to emphasize specific features relevant to the exemplary embodiments.

DETAILED DESCRIPTION

The primary failure modes to protect against are those whose efforts compromise the functions of both primary and redundant circuitry. On a circuit board, these failure modes include electrical shorts between signals of primary and redundant circuits. There are many failure mechanisms that may result in these types of shorts, including manufacturing defects like foreign material contamination, and electromigration due to voids in the insulation and the presence of moisture and electrical field. Conventional fault containment design within a circuit board relied primarily on providing physical distance between regions to contain faults. However, it can be difficult to assure that faults do not propagate across the defined physical distance.

Embodiments described herein relate to a circuit board having multiple fault containment regions. A fault containment region is a region within a circuit board that is designed to contain a fault occurring within that region in that region. Embodiments described herein separate fault containment regions by chassis ground layers within the circuit board. The chassis ground layers constrain power/logic within regions separated by chassis ground layers. A single fault open/short in such a design will only take out power/logic in its own fault containment region. The chassis ground planes provide a path for the current to flow for a circuit board flaw, thus stopping the flaw from propagating across the chassis ground plane and into an adjacent fault containment region.

Additionally, some embodiments provide electrically conductive rings surrounding a via that extend through a fault containment region to which the via is not coupled. The electrically conductive rings are coupled to a chassis ground layer. The chassis grounded conductive ring isolates the via from the fault containment region through which it extends.

Advantageously, such a design enables more simplified routing rules as compared to conventional methods which rely primarily on separation by physical distance. The simplified rules enable easier and quicker design of compliant circuit boards.

FIG. 1 is a table 100 illustrating a cross-sectional view of the layers of an example circuit board having fault containment regions separated by chassis ground layers. The table 100 illustrates the physical relationship between layers 1 through 26 of the example circuit board. Each layer (1-26) is separated by a dielectric, such as polyimide. The dielectric between adjacent layers 1-26 can also be considered a "layer" of the circuit board, although the references to a layer herein refer to the metallic based layers 1-26 unless indicated otherwise.

The leftmost column 102 of the table 100 identifies the number referenced to the layer. The $2^{nd}$ column from the left 104 identifies an example material of which the respective layer and the dielectric between the layers is composed. As shown, in this example, the conductive layers 1-26 are composed of copper and the dielectric is composed of polyimide. The $3^{rd}$ column from the left 106 identifies the weight of the conductive material (e.g., copper) in the layer 1-26. The 4$^{th}$ column from the left 108 identifies the thickness of the conductive layer 1-26 as well as the thickness of the dielectric between adjacent layers 1-26. The farthest right 110 column identifies the type and purpose of the layer 1-26. The location of the layers 1-26 and the dielectric between the layers shown in table 100 corresponds to the location of the layers in the example circuit board. For example, layer 1 is the topmost conductive layer of the circuit board and layer 26 is the bottommost conductive layer on the opposite side of the circuit board. Layers 2-25 and the dielectrics are located between layers 1 and 26 in the circuit board. As shown in the table 100, layer 1 is next to layer 2 (i.e., there are no other conductive layers therebetween), which is next to layer 3, and so on until reaching layer 26. Dielectric material is interposed between adjacent conductive layers 1-26.

The circuit board illustrated by graph 100 includes four fault containment regions 112-115 that are separated from one another by chassis ground layers. As shown, the fault containment regions 112-115 are each located in a separate set of layers and each fault containment region 112-115 is bordered on the top and bottom by a chassis ground layer. A first fault containment region 112 includes layers 2-6 of the circuit board and is bordered (e.g., defined) by chassis ground layer 1 on the top and chassis ground layer 7 on the bottom. A second fault containment region 113 includes the layers 8-12 which are the layers directly below the chassis ground layer 7 bordering the first fault containment region 112. Thus, the chassis ground layer 7 is disposed between the first fault containment region 112 and the second fault containment region 113. The second fault containment region 113 is bordered on the bottom by chassis ground layer 13. A third fault containment region 114 includes layers 15-19 and is bordered by chassis ground layer 14 on the top and chassis ground layer 20 on the bottom. Two chassis ground layers 13 and 14 are disposed between the second fault containment region 113 and the third fault containment region 114. A fourth fault containment region 115 includes layers 21-25 and is bordered by the chassis ground layer 20 and the chassis ground layer 26.

Each fault containment region 112-115 includes signal traces which have a power layer and return path (e.g., ground) layer that are separate from the chassis ground layers bordering the fault containment region 112-115. A layer that includes such signal traces is referred to herein as a "signal layer". For example, the layers 2-6 which make up the first fault containment region 112 include a power layer 2, a first signal layer 4, a first return path (e.g., ground) layer 3 for the signal layer 4, a second signal layer 5, and a second return path (e.g., ground) layer 6 for the second signal layer 5. Each of the other fault containment regions 113-115 are made up of the same type of layers, and therefore include a signal layer with its own power and return path layers that are separate from the chassis ground layers bordering that fault containment region 113-115. Moreover, the power layer, return path layer, and signal layers for each fault containment region 112-115 are separate from the power, return path, and signaling layers for other fault containment regions 112-115 such that faults occurring on or reaching any of these layers in a given fault containment region 112-115 are contained within that fault containment region 112-115.

Each of the layers 1-26 includes electrically conductive material as it is either a chassis ground layer or a layer through which electricity flows (a signal layer, a power layer, or return path layer). The chassis ground layers, the power layers, and the return path layers are each composed of a continuous sheet of an electrically conductive material, for example, a metal such as copper. As discussed above, a signal layer includes a plurality of signal traces for routing signals as desired. The power layers and the return path layers are connected to one or more signal layers at various locations in the respective layers. As used herein a first layer is "connected" to a second layer if a single via extends to each layer. That is, a first layer is "connected" to a second layer if a single via extends (e.g., on one end) to connect to the first layer and extends (e.g., on the other end) to connect to the second layer. In contrast, a first layer is not "connected" to a second layer if a first via connects the first layer to a third layer, and a second via (separate from the first via) connects the third layer to the second layer.

These connection points between the power layers and the return path layers serve as the path to allow signal layers to couple return currents to the appropriate fault containment regions to avoid cross-talk across fault containment regions ensuring proper signal quality. The Printed Board (PB) structure also assures the power to and from the fault containment region is isolated to that particular fault containment region. By assuring the fault containment region contains the proper layers to support signal integrity using a reference plane, and having the power embedded in the fault containment region, the fault containment region is isolated from other fault containment region's magnetic and electrical fields. The chassis ground planes have the added benefit of shielding those electric and magnetic fields. Therefore, the chassis ground avoids potential signal integrity issues for normal and failed operations within a fault containment region.

Within a fault containment region, the power and power supply ground (return path layer, e.g., layers 3 an 6 in FIG. 1 labeled S2_5VRTN, S2_15VRTN) provides the normal power and ground that is sourced by the power supply and the return currents return to the power supply in the same manner as a simple design. When signals transition, their cross-coupled current also returns to the power supply within the fault containment region just like the simple design. For complex designs with multiple power supplies (as shown in FIG. 1), the chassis ground separates different fault containment regions and, for this example, the structure assures the signal's cross-coupled current and power supply current cannot use the chassis ground. There are some situations where care should be taken to assure chassis ground does not carry current.

The chassis ground layers are used as a barrier between fault containment regions 112-115 and, as such, are not connected to any signal layers and do not have electrical current used by the signal layers flowing therethrough. That is, although the chassis ground layers may be coupled to one or more signal layers in a distant manner (through the return path layer), this coupling is not in such a manner that current used in the normal course in the one or more signal layers flows through the chassis ground layers. As such, there is a physical and functional distinction between a layer that is connected to another layer and a layer that is merely coupled to another layer. In an example, the chassis ground layers are configured to be electrically tied to the chassis structure. In an example, when connecting fault containment regions secondary grounds to chassis ground at a single point, this single point is placed in a location to assure the current path for that current flowing back to the power supply or from signals will not take the single point ground path to chassis ground.

Since the chassis ground layers are not used as a return path for electrical current used in the adjacent fault containment region 112-115, the chassis ground layers act as a sink to electrical flaws in their adjacent fault containment region(s) 112-115. This sink can stop electromigration in a fault containment region 112-115 by providing a path for the current to flow out through a chassis ground thereby restricting electromigration from crossing into an adjacent fault containment region 112-115 on the other side of the chassis ground.

Such a structure assures that power to and from a given fault containment region 112-115 is isolated to that particular fault containment region 112-115. By assuring that each fault containment region 112-115 contains a return path layer to act as a dedicated reference plane to support signal integrity, and also has a dedicated power layer in the fault containment region 112-115, each fault containment region 112-115 is self-contained. With a chassis ground separating the power, ground and signals across fault containment regions, the chassis ground isolates the magnetic and electrical fields of the other fault containment regions 112-115. The chassis ground planes shield those electric and magnetic fields from one fault containment region and assure they do not impact a separate fault containment region. The chassis ground layers, therefore, reduce signal integrity issues for normal and failed operations within a fault containment region 112-115.

A circuit board having such fault containment regions 112-115 separated by chassis ground includes routing within each fault containment region 112-115 that is separate from other fault containment regions 112-115. The fault containment regions 112-115 can include buried vias (i.e., vias that only connect to the layers within the fault containment region) in order to facilitate the routing within the fault containment region 112-115. Blind-vias (i.e., vias that extend from the surface layer through half of the layers) and through-vias (i.e., vias that extend through the entire circuit card) can include ground rings as described in more detail below to assure faults cannot propagate.

Often times fault containment regions 112-115 are used to provide redundancy in an electronic system. Such redundancy is used to address the issue of when one component or circuit fails. If such a failure occurs, the failing component/circuit can be disabled (e.g., turned off) and its redundant component can be enabled (e.g., turned on) instead. In such instances, different fault containment regions 112-115 can correspond to different components outside of the circuit board. In particular, different fault containment regions 112-115 can correspond to different ones of a set of redundant components/devices. For example, a first fault containment region 112 can be connected to a primary component/device and a second fault containment region 113 can be connected to a redundant component/device. In this way, if a fault occurs in the first fault containment region 112 which causes the primary component/device to fail, the first component/device and first fault containment region 112 can be disabled, and the second fault containment region 113 and second component/device can be used instead.

FIG. 2 is a block diagram of an example of such a system. FIG. 2 illustrates a circuit board 250 having a plurality of vias 252 that couple to respective fault containment regions 1-4 within the circuit board. This example illustrates 4 redundant components where 3 of the redundant components have to operate properly to assure mission success. This example system would be adequate to meet a 1 fault tolerant requirement where a single fault cannot compromise the function of the 3 remaining redundant components. Other systems could have multiple redundant components that share a single fault containment region (FCR).

The fault containment regions 1-4 are separated by chassis ground layers and each fault containment region 1-4 corresponds to the structure discussed above with respect to FIG. 1. Notably, each fault containment region 1-4 includes one or more power layers, signal layers, and return path layers that are separate from the chassis ground layers separating the fault containment region from other regions.

The first fault containment region (FCR1) is coupled to a first redundant component and a second fault containment region (FCR2) is coupled to a second redundant component. Similarly, a third fault containment region (FCR3) is coupled to a third redundant component and a fourth fault containment region (FCR4) is coupled to a fourth redundant component. As redundant components, each of the first, second, third, and fourth redundant components are configured to perform the same task. In an example, the first, second, third, and fourth components are identical to one another. Accordingly, if a fault occurs in any of the fault containment regions 1-4 that causes the redundant component coupled to that fault containment region to be disabled, the fault can be contained in that fault containment region such that it does not affect the other fault containment regions or their coupled components. As such, the task performed by the first, second, third, and fourth redundant components can still be accomplished by the remaining components. As should be understood, the number of fault containment regions (4) and components (4) is merely an example. Any number of fault containment regions and components can exist in a particular system. Moreover, there need not be a one-to-one correspondence between a fault containment region and components as shown in FIG. 2. That is, in other examples, a single component can be coupled to two or more fault containment regions and/or multiple components can be coupled to a single fault containment region.

The working relationship between the first, second, third, and fourth redundant components can be any redundant relationship. For example, one or more of the redundant components can be primary components that are enabled to perform the required task initially, while the other redundant components can be disabled unless and until a primary component fails and one of the other redundant components is enabled to take its place. In another example, all the redundant components can be enabled and operating initially and input from all the redundant components can be accepted by the downstream system which averages, selects the best, or otherwise analyzes all the outputs to obtain the required information for the task. In such an example, the system can be designed such that fewer than all of the redundant components are necessary to complete the task. Thus, if one or more of the redundant components fails, the task can still be completed based on the information from the other redundant components.

In a circuit board having multiple fault containment regions 112-115, it can be challenging to provide a proper reference for a signal that crosses a fault containment region. In an example, a differential signal pair is used for a signal that crosses a fault containment region to avoid this effect. In some examples, a single-ended signal must cross over a fault containment region. For such an example, a signal-ended signal is run in parallel to a ground trace to allow the signal to cross over a fault containment region and remain referenced to the proper return plane, thereby enhancing signal quality. One such instance arising often in redundant systems occurs when using electrically isolated components such as optocouplers or other devices with similar isolating features. For such optocoupler circuits, the drive circuit can be designed such that the return of the optocoupler is directly to a ground. For this case, a ground trace from the optocoupler in the receiving fault containment region can return to the source fault containment region and utilize the source ground. Routing the optocoupler source/sink in parallel is a method to overcome signal integrity issues for signals crossing ground planes of separate fault containment regions. Also, for a signal crossing a fault containment region, the layers for supporting the power may not be needed with the ground layers remaining to assure currents return to the proper ground allowing the structure for routing these signals to be tailored for these signals.

There are also complex multiple components that can share a fault containment region (e.g., multiple processor circuit cards). For these signals, the embedded power, ground, and signal layers provide the proper references to allow ease of routing and can support a large quantity of single-ended signals without a concern for crossing ground references maintaining signal quality and protection from electric and magnetic fields crossing over into adjacent fault containment regions. The layer structure in FIG. 1 allows the signal layers to use buried vias that do not escape their fault containment region. Buried-vias are a standard industry practice allowing the advanced concept to support printed board standard manufacturing capabilities.

Figure 3A:
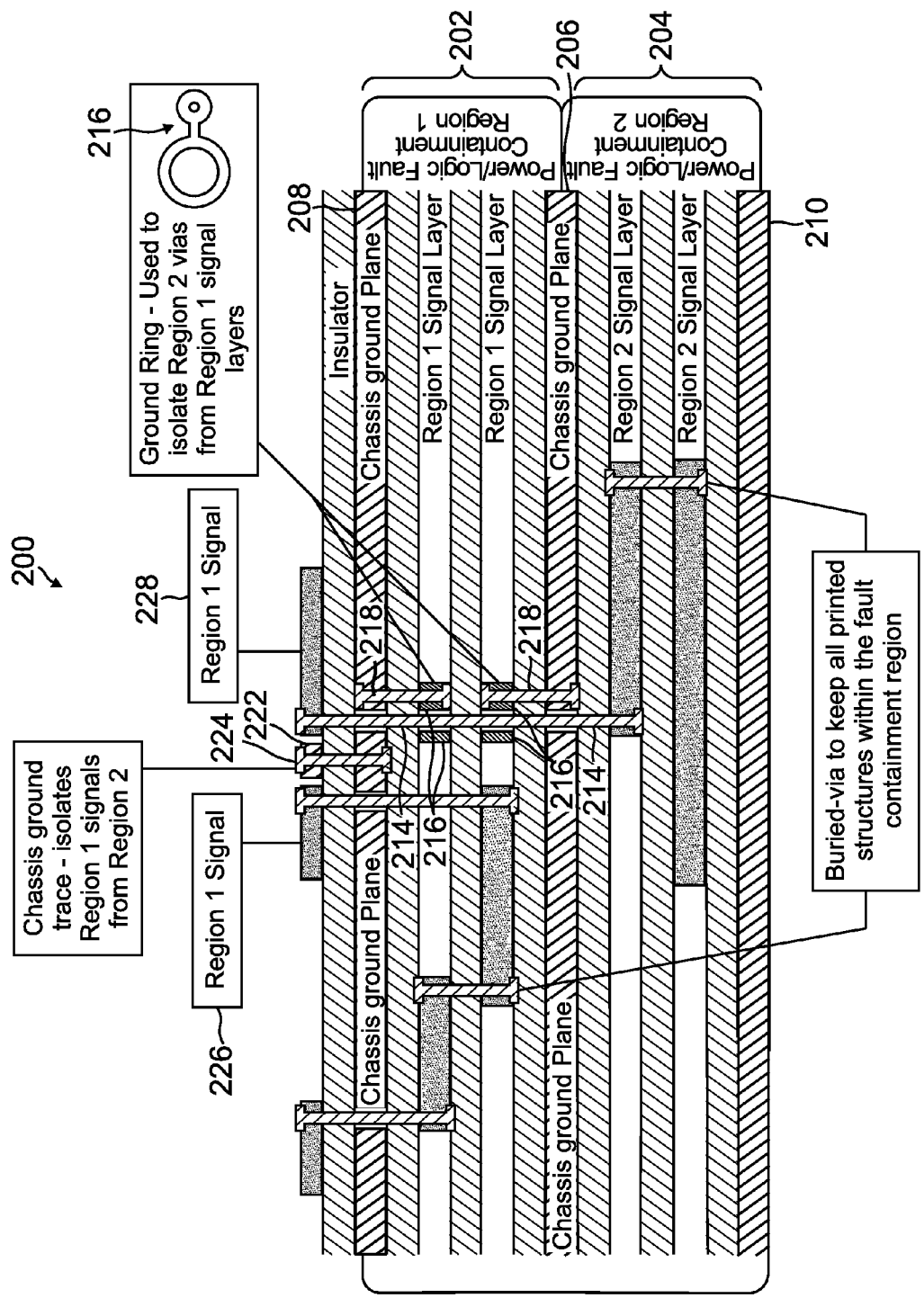
FIG. 3A is a cross-sectional view of another example circuit board having fault containment regions separated by chassis ground layers and a through board via surrounded by an electrically conductive ring.

FIG. 3A is a cross-sectional view of another example circuit board 200 having fault containment regions 202 and 204 separated by a chassis ground layer 206. As shown, the first fault containment region 202 is disposed between a first chassis ground layer 206 and a second chassis ground layer 208. The second fault containment region 204 is disposed between the second chassis ground layer 208 and a third chassis ground layer 210. For simplicity only the signal layers in each fault containment region 202, 204 are shown, however, each fault containment region 202, 204 includes a power layer and a return path layer as discussed above. The fault containment regions 202, 204 can include one or more blind vias 212 to facilitate routing within each fault containment region 202, 204. Also, FIG. 3A does not illustrate the proper via manufacturing techniques (buried/blind/through vias) in order to emphasize the fault containment region concepts discussed herein.

Additionally, one or more vias, for example via 214, can extend from a fault containment region (202) outside of the fault containment region 204. For such a via (214) that extends from a fault containment region (204) through a different fault containment region (202) with which that via (214) is not connected, an electrically conductive ring 216 can be disposed around the via (214) in layers within the other fault containment region (202). Such an electrically conductive ring 216 is spaced apart from the via 214 (e.g., dielectric material is disposed between the electrically conductive ring and the via 214) and the electrically conductive ring 216 is connected to a chassis ground layer 206, 208. Such an electrically conductive ring can be disposed in each layer of the other fault containment region 202, thereby isolating the via 214 from those layers and, therefore, from the fault containment region 202. This electrically conductive ring isolating the via 214 (which is coupled to fault containment region 204) from the fault containment region 202 ensures that faults in either fault containment region 202 or 204 do not propagate to the other fault containment region 204, 202. Another via 218 can be used to connect the electrically conductive ring 216 to a chassis ground layer 206, 208.

Figure 3B:
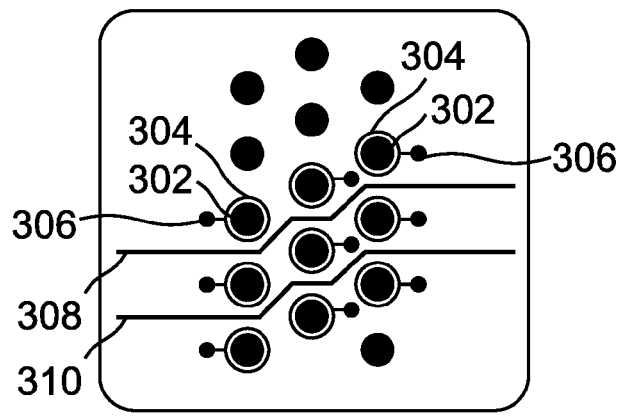
FIG. 3B is a top cross-sectional view of a surface layer of a circuit board illustrating electrically conductive ground rings and electrically conductive ground traces.

Electrically conductive rings can also be used around connectors on a surface of a circuit board. FIG. 3B is a top view of the outer surface layer of an example circuit board 300 including a plurality of connectors 302 having electrically conductive rings 304 around them. Such an electrically conductive ring 304 (also shown at 216 in FIG. 3A) can be used around surface mount connectors and through-hole connectors. These electrically conductive rings 304 can also be connected to a chassis ground layer through a via 306. In some examples, such as for connectors with very small through-hole features, a larger electrically conductive trace or ring can surround multiple individual connection points. Although FIG. 3B is an example of an outer surface layer, similar ground rings and traces can be used in internal layers, such as signal layers in fault containment regions 202, 204.

Also, an electrically conductive trace connected to chassis ground can be used within a layer to demarcate fault containment regions within the same layer. Such a trace can be connected to a chassis ground layer through a ground via. Examples of such a trace 222 are shown in FIGS. 3A and 3B. The example trace 222 shown in FIG. 3A is a surface trace that extends between a left fault containment region 226 on the surface of the circuit board 200 and a right fault containment region 228 on the surface of the circuit board 200. The trace 222 is connected to the chassis ground layer 208 through the via 224. Since the trace 222 is connected to the chassis ground layer 208, the trace can act as a signal sink for adjacent fault containment regions 226, and 228 in same manner as the chassis ground layers discussed above. The trace 222, therefore defines the boundary between lateral fault containment regions 226, 228 on the surface of the circuit board 200. Accordingly, such a trace connected to the chassis ground layer can be used to provide multiple fault containment regions within a single layer. As shown in FIG. 3A, this can be used along with the vertical division of fault containment regions to provide 3-dimensional dividing up of the circuit board into fault containment regions. In FIG. 3B, examples of such a trace are shown by traces 308, 310 which extend between respective vias/pins of an isolated fault containment region to restrict a flaw from propagating to the pins/vias of the separate fault containment region.

Figure 4:
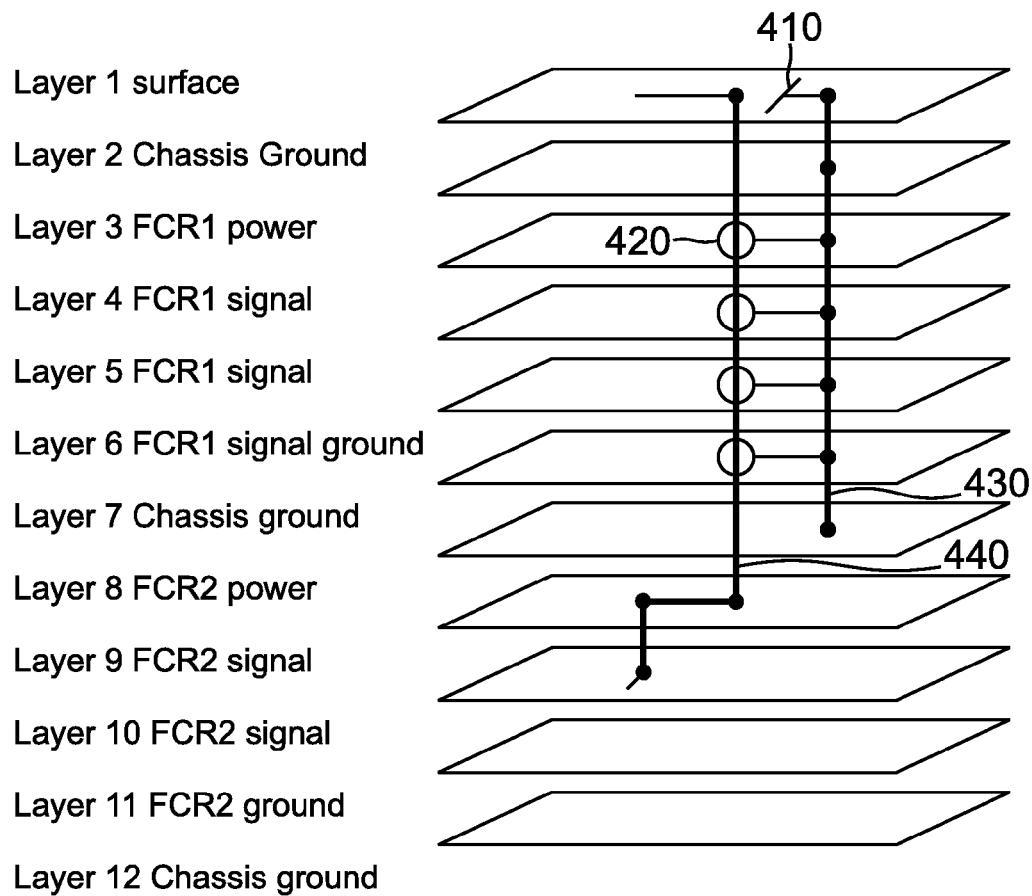
FIG. 4 is an exploded view see-through view of an example circuit board having electrically conductive ground rings surrounding a via extending therethrough.

FIG. 4 is a cut-away see-through view of an example circuit board 400 and is used to further clarify the discussions of FIGS. 3A and 3B. The circuit board 400 includes a first fault containment region (FCR1) and a second fault containment region (FCR2). In the same manner as described above, the first fault containment region is bordered on the top by a first chassis ground layer (layer 2) and on the bottom by a second chassis ground layer (layer 7). The second fault containment region is bordered by the second chassis ground layer (layer 7) and a third chassis ground layer (layer 12). The first fault containment region includes a power layer (layer 3), two signal layers (layers 4 and 5), and a return path layer (layer 6). The second fault containment region also includes a power layer (layer 8), two signal layers (layers 9 and 10), and a return path layer (layer 11).

The circuit board 400 shows an example of a signal via 440 that extends from a trace in the surface layer (layer 1) through layers 2-6 which are within the first fault containment region to connect to a trace in layer 8 in the second fault containment region. The signal via 440 is isolated from each of layers 2-8 and is connected to traces in layers 1 and 9 as mentioned above. An electrical ground ring 420 surrounds the signal via 440 in each of the layers (layers 3-6)

of the first fault containment region. The electrical ground rings 420 isolate the signal via 440 from the respective layer (layers 3-6) of the first fault containment region. Each electrical ground ring 420 is shorted to chassis ground by being connected to a ground via 430 which is connected to chassis ground planes (e.g., in layers 2 and/or 7). Although not shown each via 440, 430 is also isolated from each layer using normal printed board processes except where intended to be connected to that layer. Accordingly, conventional via routing processes can be used to route the signal via 440 through any layers that are in the same fault containment region (FRC2) that the signal via 440 connects to.

On the surface layer (layer 1) an electrical ground ring and/or an electrical ground trace 410 coupled to chassis ground via the ground via 430 can be used to isolate a first trace on the surface layer (layer 1) from a second trace on the surface layer where the first and second traces are connected to the first and second fault containment regions respectively.

Figure 5:
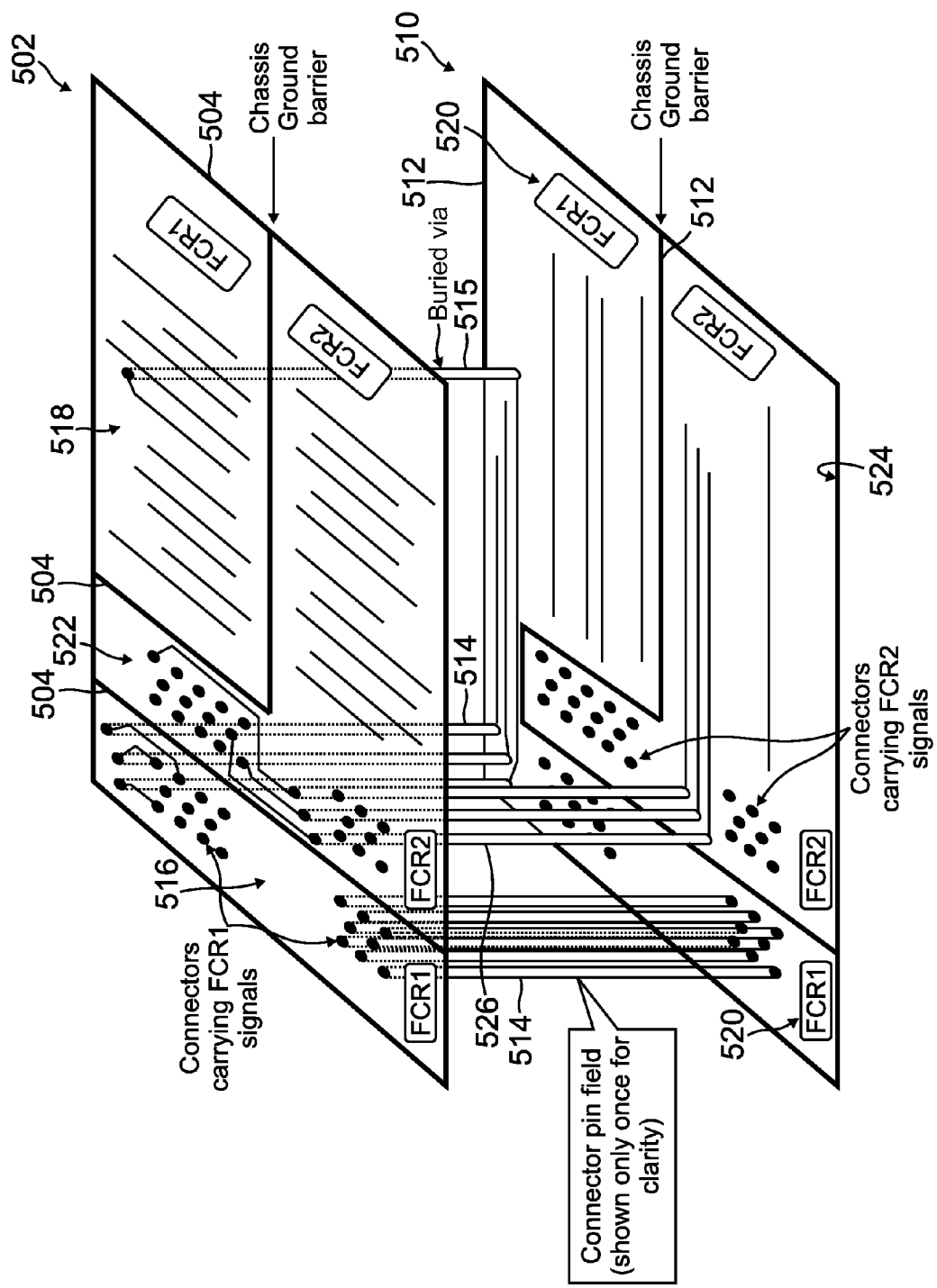
FIG. 5 is a view of two example layers of a circuit board having a plurality of traces in internal layers separated into multiple lateral fault containment regions.

FIG. 5 is an exploded see-through view of an example of two internal layers within a circuit board. Both layers shown in FIG. 5 contain two fault containment regions (FCR1, FCR2) separated by a respective ground barrier (trace). For example, a first layer 502 includes a first ground trace 504 that extends around a perimeter of the first layer 502 and through the first layer 502 to demarcate and isolate a first fault containment region FCR1 from a second fault containment region FCR2. In this example, the first fault containment region FCR1 occupies two distinct areas 516, 518 on the first layer 502. These two areas 516, 518, however, are coupled together to form a single fault containment region FCR1. A second layer 510 also contains both the first and second fault containment regions FCR1, FCR2. The second layer 510 also includes a second ground trace 512 that extends around a perimeter of the second layer 510 and through the second layer 510 to demarcate and isolate the first fault containment region from the second fault containment region FCR2. This second layer adds another portion (520) of fault containment region 1 (FCR1). Similarly, fault containment region 2 (FCR2) contains multiple areas 522 on layer 1 (502) and 524 on layer 2 (510).

The ground traces 504, 512 divide the respective layers 502, 510, to form the first (lateral) fault containment region FCR1 on one side of the traces 504, 512 and the second (lateral) fault containment region on the other side of the traces 504, 512. The ground traces 504, 512 are coupled to chassis ground using a via (not shown in FIG. 5) that connects to the ground trace 504 and extends up and/or down through the circuit board to connect to a chassis ground layer. In some examples, a defined physical distance can also be used with or without such a trace 504, 512 to isolate different fault containment regions FCR1, FCR2 within the same layer. If a trace 504, 512 is used in conjunction with a physical distance, the trace 504, 512 can be located near the middle of the dielectric between the adjacent fault containment regions within the layer.

FIG. 5 also illustrates a plurality of vias 514, 515, 526 that extend between the first and second layers 502, 510. The vias 514, 515 can be used to connect the two distinct areas 516, 518 of the first fault containment region FCR1 on the first layer 502 together by coupling each area to the area 520 of the first fault containment region FCR1 on the second layer 510. That is, a first via 514 can connect the first area 516 on the first layer 502 to area 520 of the first fault containment region FCR1 on the second layer 510. A second via 515 can couple the second area 520 to the second area 518 on the first layer 502. In this example, the two distinct areas 516, 518 of the first fault containment region FCR1 on the first layer 502 cannot be coupled together within the first layer 502 because the second fault containment region FCR2 extends all the way across the first layer 502 between the two areas 516, 518, which blocks any potential path between the areas 516, 518. The vias 514, 515, however, can be used to provide a signal path downward from the first area 516 to the second layer 510, across, and upwards to the second area 518. The vias 526 can connect area 522 of the first layer 502 to area 524 of the second layer 510.

Additionally, the chassis ground traces 504 restrict a fault in either 516 or 518 from propagating into region 522. Similarly, the areas 520 and 524 on the second layer 510 are isolated by chassis ground 512 to restrict a fault from propagating between fault containment region FCR1 and fault containment region FCR2.

For layers having lateral fault containment regions, in order to provide signal integrity, signals associated with fault containment region 1 can have a signal ground plane adjacent each layer (above 502/below 510) that mirrors the shape of each area within fault containment region FCR1. Similarly, signals associated with fault containment region 2 can have a signal ground plane adjacent each layer (above 502/below 510) that mirrors the shape of each area within fault containment region FCR2. For such signal ground planes the areas corresponding to the chassis ground traces 504, 512 (i.e., above/below the chassis ground traces 504, 512) are isolation areas to separate the signal grounds in the laterally adjacent fault containment regions.

In some examples, a circuit board can use foreign material blocking to reduce the likelihood of an unintended conductive material getting under a component mounted on the circuit board and causing an unintended circuit connection. Such foreign material blocking can be accomplished by using manufacturing processes like under-fill with coating processes or sealing them with epoxy to assure isolation of the pins from open space. Current limiting and other electrical approaches can also be used to avoid mechanical failure due to part failures that cause heat damage that could propagate to other components.

Although the examples discussed herein include a given number of fault containment regions, and a given number of signal layers, power layers, and return path layers within each fault containment region, it should be understood that a circuit board corresponding to the teachings herein is not limited to the specific number of fault containment regions, signal layers, power layers, and return path layers described herein. A circuit board corresponding to the teachings herein can have two or more fault containment regions and one or more of signal layers, power layers, and return path layers in each fault containment regions. Moreover, each fault containment region can have the same or a different number of signal, power, or return path layers as compared to other fault containment regions within the circuit board.

EXAMPLE EMBODIMENTS

Example 1 includes a circuit board comprising: a first fault containment region defined, at least in part, by first and second metal layers coupled to ground; the first fault containment region including: a first signal layer between the first and second metal layers; a third metal layer between the first and second metal layers, the third metal layer connected to the first signal layer to provide a return path for the first signal layer; and a fourth metal layer between the first and second metal layers, the fourth metal layer connected to the first signal layer to provide power to the first signal layer;

and a second fault containment region in a plurality of layers below the first fault containment region, the second fault containment region defined, at least in part, by a fifth metal layer and the second metal layer, the second fault containment region including: a second signal layer between the second and fifth metal layers; a sixth metal layer between the second and fifth metal layers, the sixth metal layer connected to the second signal layer to provide a return path for the second signal layer; and a seventh metal layer between the second and fifth metal layers, the seventh metal layer connected to the second signal layer to provide power for the second signal layer.

Example 2 includes the circuit board of Example 1, wherein the first, second, and fifth metal layers are not connected to the first signal layer, the fourth metal layer, the second signal layer, or the seventh metal layer.

Example 3 includes the circuit board of any of Examples 1-2, wherein the first, second, and fifth metal layers are either not connected to one or both of the third metal layer and the fifth metal layer, or only connected to one or both of the third metal layer and the fifth metal layer near an edge of the circuit board.

Example 4 includes the circuit board of any of Examples 1-3, wherein the first, second, and fifth metal layers are each composed of a continuous metal sheet.

Example 5 includes the circuit board of any of Examples 1-4, wherein the third and fourth metal layers are connected to the first signal layer such that electric current used by components in the first signal layer propagates through the third and fourth metal layers, wherein the seventh and eighth metal layers are connected to the second signal layer such that electric current used by components in the second signal layer propagates through the seventh and eighth metal layers.

Example 6 includes the circuit board of any of Examples 1-5, comprising: a dielectric material between each layer.

Example 7 includes the circuit board of any of Examples 1-6, comprising: a through board signal via connected to a signal trace in the second signal layer, the through board signal via extending from the second signal layer through the second metal layer, the first signal layer, the fourth metal layer, the third metal layer, and the first metal layer; an electrically conductive ring surrounding the signal via in the first signal layer; and a dielectric material between the electrically conductive ring and the through board signal via; and a through board ground via connecting the electrically conductive ring to the first metal layer.

Example 8 includes the circuit board of any of Examples 1-7, comprising: one or more surface mount connectors on a first surface of the circuit board; an electrically conductive ring surrounding the one or more surface mount connectors; and a dielectric material between the electrically conductive ring and the one or more surface connectors; and a through board ground via connecting the electrically conductive ring to the first metal layer.

Example 9 includes the circuit board of any of Examples 1-8, comprising: a trace extending across a first surface of the circuit board; a through board ground via connecting the electrically conductive ring to the first metal layer, wherein the trace demarcates a third lateral fault containment region on the first surface from a fourth lateral fault containment region on the first surface.

Example 10 includes the circuit board of any of Examples 1-9, comprising: a first trace extending across the circuit board in the first signal layer; a second trace aligned with the first trace and extending across the circuit board in the third metal layer; a third trace aligned with the first trace and extending across the circuit board in the fourth metal layer; and one or more through board ground vias coupling the first trace, second trace, and third trace to one or both of the first metal layer and the second metal layer.

Example 11 includes a redundant system including a fault containment circuit board, the system comprising: a first redundant component and a second redundant component, wherein the first redundant component and the second redundant component are configured to perform the same task; a circuit board including: a first fault containment region defined, at least in part, by first and second metal layers connected to ground; the first fault containment region including: a first signal layer between the first and second metal layers; a third metal layer between the first and second metal layers, the third metal layer connected to the first signal layer to provide a return path for the first signal layer; and a fourth metal layer between the first and second metal layers, the fourth metal layer connected to the first signal layer to provide power for the first signal layer; and a second fault containment region in a plurality of layers below the first fault containment region, the second fault containment region defined, at least in part, by a fifth metal layer and the second metal layer, the second fault containment region including: a second signal layer between the second and fifth metal layers; a sixth metal layer between the second and fifth metal layers, the sixth metal layer connected to the second signal layer to provide a return path for the second signal layer; and a seventh metal layer between the second and fifth metal layers, the seventh metal layer connected to the second signal layer to provide power to the second signal layer; wherein the first redundant component is coupled to the first signal layer and not the second signal layer, wherein the second redundant component is coupled to the second signal layer and not the first signal layer.

Example 12 includes the redundant system of Example 11, wherein the first, second, and fifth metal layers are not connected to the first signal layer, the fourth metal layer, the second signal layer, or the seventh metal layer.

Example 13 includes the redundant system of any of Examples 11-12, wherein the first, second, and fifth metal layers are either not connected to one or both of the third metal layer and the fifth metal layer, or only connected to one or both of the third metal layer and the fifth metal layer near an edge of the circuit board.

Example 14 includes the redundant system of any of Examples 11-13, wherein the first, second, and fifth metal layers are each composed of a continuous metal sheet.

Example 15 includes the redundant system of any of Examples 11-14, wherein the third and fourth metal layers are connected to the first signal layer such that electric current used by components in the first signal layer propagates through the third and fourth metal layers, wherein the seventh and eighth metal layers are connected to the second signal layer such that electric current used by components in the second signal layer propagates through the seventh and eighth metal layers.

Example 16 includes the redundant system of any of Examples 11-15, comprising: a dielectric material between each layer.

Example 17 includes a circuit board comprising: a through board signal via connected to a signal trace in a first signal layer, the through board signal via extending from the first signal layer through a second signal layer; an electrically conductive ring surrounding the signal via in the second signal layer; and a dielectric material between the electrically conductive ring and the through board signal via; and a through board ground via connecting the electrically conductive ring to a first metal layer, wherein the first metal layer is composed of a continuous metal sheet that is coupled to ground.

Example 18 includes the circuit board of Example 17, a fault containment region defined, at least in part, by the first metal layer, wherein the second signal layer is within the fault containment region and wherein the first signal layer is outside of the fault containment region, wherein the through board signal via extends through the fault containment region and is not connected to a layer within the fault containment region.

Example 19 includes the circuit board of Example 18, wherein the fault containment region is defined by a second metal layer and the first metal layer, wherein the second signal layer is disposed between the first metal layer and the second metal layer, wherein, in addition to the second signal layer, the fault containment region includes: a third metal layer disposed between the first and second metal layers, the third metal layer connected to the second signal layer to provide a return path for the second signal layer; and a fourth metal layer disposed between the first and second metal layers, the fourth metal layer connected to the first signal layer to provide power to the second signal layer.

Example 20 includes the circuit board of Example 19, wherein the first and second metal layers are not connected to the first signal layer or the second signal layer, wherein the first signal layer is not connected to the second signal layer, the third metal layer or the fourth signal layer, wherein the first and metal layers are either not connected to one or both of the third and fourth metal layer or only connected to the third and fourth metal layer near an edge of the circuit board, wherein the circuit board includes a dielectric material between each layer.

What is claimed is:

1. A circuit board comprising:
   a first fault containment region defined, at least in part, by first and second metal layers coupled to ground; the first fault containment region including:
   a first signal layer between the first and second metal layers;
      a third metal layer between the first and second metal layers, the third metal layer connected to the first signal layer to provide a return path for the first signal layer; and
      a fourth metal layer between the first and second metal layers, the fourth metal layer connected to the first signal layer to provide power to the first signal layer; and
   a second fault containment region in a plurality of layers below the first fault containment region, the second fault containment region defined, at least in part, by a fifth metal layer and the second metal layer, the second fault containment region including:
   a second signal layer between the second and fifth metal layers;
      a sixth metal layer between the second and fifth metal layers, the sixth metal layer connected to the second signal layer to provide a return path for the second signal layer; and
      a seventh metal layer between the second and fifth metal layers, the seventh metal layer connected to the second signal layer to provide power for the second signal layer.

2. The circuit board of claim 1, wherein the first, second, and fifth metal layers are not connected to the first signal layer, the fourth metal layer, the second signal layer, or the seventh metal layer.

3. The circuit board of claim 1, wherein the first, second, and fifth metal layers are either not connected to one or both of the third metal layer and the fifth metal layer, or only connected to one or both of the third metal layer and the fifth metal layer near an edge of the circuit board.

4. The circuit board of claim 1, wherein the first, second, and fifth metal layers are each composed of a continuous metal sheet.

5. The circuit board of claim 1, wherein the third and fourth metal layers are connected to the first signal layer such that electric current used by components in the first signal layer propagates through the third and fourth metal layers,
   wherein the seventh and eighth metal layers are connected to the second signal layer such that electric current used by components in the second signal layer propagates through the seventh and eighth metal layers.

6. The circuit board of claim 1, comprising:
   a dielectric material between each layer.

7. The circuit board of claim 1, comprising:
   a through board signal via connected to a signal trace in the second signal layer, the through board signal via extending from the second signal layer through the second metal layer, the first signal layer, the fourth metal layer, the third metal layer, and the first metal layer;
   an electrically conductive ring surrounding the signal via in the first signal layer; and
   a dielectric material between the electrically conductive ring and the through board signal via; and
   a through board ground via connecting the electrically conductive ring to the first metal layer.

8. The circuit board of claim 1, comprising:
   one or more surface mount connectors on a first surface of the circuit board;
   an electrically conductive ring surrounding the one or more surface mount connectors; and
   a dielectric material between the electrically conductive ring and the one or more surface connectors; and
   a through board ground via connecting the electrically conductive ring to the first metal layer.

9. The circuit board of claim 1, comprising:
   a trace extending across a first surface of the circuit board;
   a through board ground via connecting an electrically conductive ring to the first metal layer, wherein the trace demarcates a third lateral fault containment region on the first surface from a fourth lateral fault containment region on the first surface.

10. The circuit board of claim 1, comprising:
    a first trace extending across the circuit board in the first signal layer;
    a second trace aligned with the first trace and extending across the circuit board in the third metal layer;
    a third trace aligned with the first trace and extending across the circuit board in the fourth metal layer; and
    one or more through board ground vias coupling the first trace, second trace, and third trace to one or both of the first metal layer and the second metal layer.

11. A redundant system including a fault containment circuit board, the system comprising:
    a first redundant component and a second redundant component, wherein the first redundant component and the second redundant component are configured to perform the same task;

a circuit board including:
a first fault containment region defined, at least in part, by first and second metal layers connected to ground; the first fault containment region including:
a first signal layer between the first and second metal layers;
a third metal layer between the first and second metal layers, the third metal layer connected to the first signal layer to provide a return path for the first signal layer; and
a fourth metal layer between the first and second metal layers, the fourth metal layer connected to the first signal layer to provide power for the first signal layer; and
a second fault containment region in a plurality of layers below the first fault containment region, the second fault containment region defined, at least in part, by a fifth metal layer and the second metal layer, the second fault containment region including:
a second signal layer between the second and fifth metal layers;
a sixth metal layer between the second and fifth metal layers, the sixth metal layer connected to the second signal layer to provide a return path for the second signal layer; and
a seventh metal layer between the second and fifth metal layers, the seventh metal layer connected to the second signal layer to provide power to the second signal layer;
wherein the first redundant component is coupled to the first signal layer and not the second signal layer,
wherein the second redundant component is coupled to the second signal layer and not the first signal layer.

12. The redundant system of claim 11, wherein the first, second, and fifth metal layers are not connected to the first signal layer, the fourth metal layer, the second signal layer, or the seventh metal layer.

13. The redundant system of claim 11, wherein the first, second, and fifth metal layers are either not connected to one or both of the third metal layer and the fifth metal layer, or only connected to one or both of the third metal layer and the fifth metal layer near an edge of the circuit board.

14. The redundant system of claim 11, wherein the first, second, and fifth metal layers are each composed of a continuous metal sheet.

15. The redundant system of claim 11, wherein the third and fourth metal layers are connected to the first signal layer such that electric current used by components in the first signal layer propagates through the third and fourth metal layers,
wherein the seventh and eighth metal layers are connected to the second signal layer such that electric current used by components in the second signal layer propagates through the seventh and eighth metal layers.

16. The redundant system of claim 11, comprising:
a dielectric material between each layer.

17. A circuit board comprising:
a through board signal via connected to a signal trace in a first signal layer, the through board signal via extending from the first signal layer through a second signal layer;
an electrically conductive ring surrounding the signal via in the second signal layer, wherein the electrically conductive ring isolates the through board signal via from the second signal layer;
a dielectric material between the electrically conductive ring and the through board signal via; and
a through board ground via connecting the electrically conductive ring to a first metal layer, wherein the first metal layer is composed of a continuous metal sheet that is coupled to ground.

18. The circuit board of claim 17,
a fault containment region defined, at least in part, by the first metal layer, wherein the second signal layer is within the fault containment region and wherein the first signal layer is outside of the fault containment region, wherein the through board signal via extends through the fault containment region and is not connected to a layer within the fault containment region.

19. The circuit board of claim 18, wherein the fault containment region is defined by a second metal layer and the first metal layer, wherein the second signal layer is disposed between the first metal layer and the second metal layer, wherein, in addition to the second signal layer, the fault containment region includes:
a third metal layer disposed between the first and second metal layers, the third metal layer connected to the second signal layer to provide a return path for the second signal layer; and
a fourth metal layer disposed between the first and second metal layers, the fourth metal layer connected to the second signal layer to provide power to the second signal layer.

20. The circuit board of claim 19, wherein the first and second metal layers are not connected to the first signal layer or the second signal layer, wherein the first signal layer is not connected to the second signal layer, the third metal layer or the fourth signal layer,
wherein the first and second metal layers are either not connected to one or both of the third and fourth metal layer or only connected to the third and fourth metal layer near an edge of the circuit board, wherein the circuit board includes a dielectric material between each layer.

* * * * *